(12) United States Patent
Alptekin et al.

(10) Patent No.: US 9,059,308 B2
(45) Date of Patent: Jun. 16, 2015

(54) METHOD OF MANUFACTURING DUMMY GATES OF A DIFFERENT MATERIAL AS INSULATION BETWEEN ADJACENT DEVICES

(75) Inventors: Emre Alptekin, Wappingers Falls, NY (US); Gregory Allen Northrop, Putnam Valley, NY (US); Viraj Yashawant Sardesai, Poughkeepsie, NY (US); Cung Do Tran, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 13/564,792

(22) Filed: Aug. 2, 2012

(65) Prior Publication Data

US 2014/0035045 A1   Feb. 6, 2014

(51) Int. Cl.
| | |
|---|---|
| H01L 21/8238 | (2006.01) |
| H01L 21/8234 | (2006.01) |
| H01L 27/088 | (2006.01) |
| H01L 29/66 | (2006.01) |
| H01L 29/49 | (2006.01) |

(52) U.S. Cl.
CPC ...... *H01L 21/823481* (2013.01); *H01L 21/823828* (2013.01); *H01L 27/088* (2013.01); *H01L 21/823437* (2013.01); *H01L 29/49* (2013.01); *H01L 29/66545* (2013.01)

(58) Field of Classification Search
CPC ............... H01L 21/823878; H01L 21/76224; H01L 21/823828
USPC ........................................................ 438/221
See application file for complete search history.

(56) References Cited

U.S. PATENT DOCUMENTS

| | | |
|---|---|---|
| 5,168,089 A | 12/1992 | Feygenson et al. |
| 5,273,621 A | 12/1993 | Feygenson et al. |
| 6,617,226 B1 | 9/2003 | Suguro et al. |
| 6,989,316 B2 | 1/2006 | Suguro et al. |
| 2006/0166427 A1* | 7/2006 | Akasaka ........................ 438/199 |
| 2011/0159678 A1* | 6/2011 | Hsu et al. ....................... 438/587 |
| 2012/0091540 A1* | 4/2012 | Cheng et al. .................. 257/410 |
| 2013/0075796 A1* | 3/2013 | Tsai et al. ....................... 257/288 |

OTHER PUBLICATIONS

Blosse et al. "A Novel Low Cost 65nm CMOS Process Architecture With Self Aligned Isolation and W Cladded Source/Drain". Cypress Semiconductor, San Jose, CA, 2004 IEEE. pp. 28.5.1-28.5.4.
Filed Application FIS920120015US1, Titled: "Forming Facet-Less Epitaxy With Self-Aligned Isolation", Filed on Jul. 24, 2012, U.S. Appl. No. 13/556,406.
Filed Application FIS920120052US1, Titled: "Forming facet-less epitaxy with a cut mask" Filed on May 23, 2012, U.S. Appl. No. 13/478,411.

* cited by examiner

*Primary Examiner* — Peniel M Gumedzoe
*Assistant Examiner* — Christopher Johnson
(74) *Attorney, Agent, or Firm* — Steven M. Kellner; Yuanmin Cai

(57) ABSTRACT

Embodiments of the present invention include a semiconductor structure including two transistor structures separated by a dummy gate of a different material and methods for forming said structure. Embodiments including forming sacrificial gates on a semiconductor substrate, forming spacers on the sacrificial gates, forming source/drain regions adjacent to two sacrificial gates separated by a third sacrificial gate, and replacing the third sacrificial gate with an insulating material. The insulating material replacing the third sacrificial gate may serve as a dummy gate to electrically isolate nearby source/drain regions. Embodiments further include forming sacrificial gates on a semiconductor substrate, forming spacers on the sacrificial gates, forming source/drain regions adjacent to two sacrificial gates separated by a third sacrificial gate, and replacing the two sacrificial gates with metal gates while leaving the third sacrificial gate in place to serve as a dummy gate.

14 Claims, 17 Drawing Sheets

METHOD OF MANUFACTURING DUMMY GATES OF A DIFFERENT MATERIAL AS INSULATION BETWEEN ADJACENT DEVICES

BACKGROUND

The present invention generally relates to integrated circuit devices, and particularly to structures for isolating adjacent devices without the use of shallow trench isolation (STI).

Due to the nature of epitaxial growth and certain structural features of integrated circuit devices, epitaxially grown regions may exhibit undesirably formed shapes that impact device performance and reliability. For example, the formation of epitaxially grown raised source/drain regions at the edge of STI regions of semiconductor devices may cause the raised source/drain regions to have faceted shapes at the STI region edges. The faceted shape of these raised source/drain regions may reduce the surface area of the raised source/drain regions. This reduced surface area in turn may undesirably increase the resistance between the raised source/drain regions and any formed contacts that are operable to provide device connectivity. Thus, since within integrated circuits a vast number of connections are needed, any degradation in connection resistance may compromise device operation within the integrated circuits and, therefore, lead to a reduction in device performance and yield.

FIG. 1 refer to a semiconductor structure 100 derived from a processes associated with growing epitaxial regions at the edges of STI regions formed on an SOI substrate, as is known in the art. In particular, FIG. 1 illustrates grown source/drain regions 130 and 170 for nFET and pFET devices 101 and 103, respectively. As depicted, the source/drain regions 130, 170 are grown at the edge of STI region 102, which includes divots 140, 180.

Source/drain regions 130 and 170 are formed after creating STI region 102. As depicted, the STI region 102 includes divots 140 and 180, which are a bi-product of the STI formation process. Since the STI region 102 and its corresponding divots 140, 180 are formed prior to growth of the source/drain regions 130, 170, during such epitaxial growth; faceting occurs at the respective interfaces 138, 141 between the grown source/drain regions 130, 170 and the STI region 102. Accordingly, based on the created facets 176, 132 that result from the formed divots 180, 140 associated with STI region 102, source/drain regions 130 and 170 include reduced contact surfaces S1 and S1' for connecting to contacts 190b and 190c, respectively. The reduced surfaces may establish a poor electrical connection with the contacts 190b, 190c. Poor electrical connections cause increased contact resistance and, therefore, a potential device operation failure.

In contrast, source/drain regions 128 and 172, which are not located adjacent the STI region 102, are not effected by the STI region's 102 formed divots 180, 140 and, therefore, do not exhibit the faceting observed at source/drain regions 130 and 170. Therefore, contact surfaces S2 and S2' for connecting to contacts 190a and 190d, respectfully, provide optimal electrical connectivity relative to contact surfaces S1 and S1'.

Source/drain regions which are bounded by STI regions are important to the layout of practical circuits. They isolate connections to unrelated transistors in a circuit, allowing flexibility in the placement and connectivity between transistors. One potential solution to the contact degradation requires the addition of an additional unused gate to allow the extension of adjacent source/drain regions make them similar to non-STI bounded ones. This results in the addition of one unused device space for every required device break, resulting in a significant loss in circuit density of upwards of 20%. Therefore, a process which allows for the isolation of adjacent transistors without incurring the reduced quality source/drain regions while reducing the loss of circuit density is desirable.

BRIEF SUMMARY

The present invention relates to a semiconductor device including two transistors separated by a dummy gate of a different material and methods of forming said semiconductor device.

One embodiment of the present invention includes a semiconductor substrate; a first transistor including a first metal gate, spacers on the sidewalls of the first metal gate, source/drains on each side of the first metal gate; a second transistor including a second metal gate, spacers on the sidewalls of the second metal gate, and source drains on each side of the second metal gate; and a dummy gate located on the surface of the semiconductor substrate between the first transistor and the second transistor. In one embodiment, the dummy gate includes an insulating material that electrically isolates the source/drains of the first transistor from the source/drains of the second transistor.

Another embodiment includes forming, on a semiconductor substrate, a first sacrificial gate, a second sacrificial gate, and a third sacrificial gate located between the first sacrificial gate and the second sacrificial gate; forming spacers on sidewalls of the first sacrificial gate, the second sacrificial gate, and the third sacrificial gate; forming a first source/drain on the semiconductor substrate between the first gate and the third gate, and a second source/drain on the semiconductor substrate between the second gate and the third gate; removing the third sacrificial gate to form a dummy recess region; and filling the dummy recess region with insulating material to form a dummy gate. The dummy gate isolates the first source/drain from the second source drain.

Another embodiment of the present invention includes forming, on a semiconductor substrate, a first sacrificial gate, a second sacrificial gate, and a third sacrificial gate located between the first sacrificial gate and the second sacrificial gate; forming spacers on sidewalls of the first sacrificial gate, the second sacrificial gate, and the third sacrificial gate; forming a first source/drain on the semiconductor substrate between the first gate and the third gate, and a second source/drain on the semiconductor substrate between the second gate and the third gate; removing the first and the second sacrificial gates to form gate recess regions; and filling the gate recess regions with metal to form metal gates. In some embodiments, the third sacrificial gate may comprise an insulating material.

Figure 1:
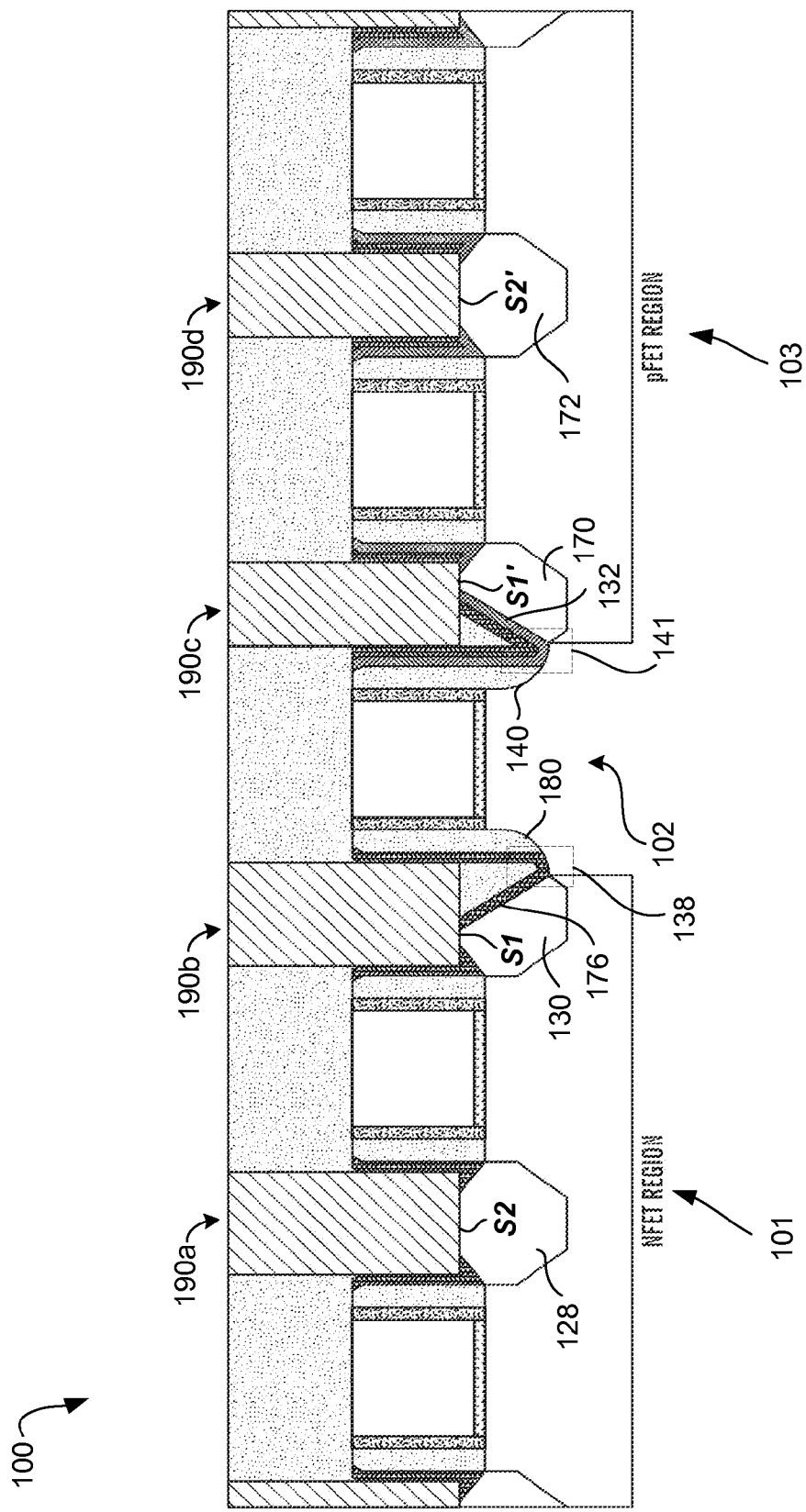
FIG. 1 is a vertical cross-sectional view of a semiconductor structure that illustrates the formation of facetted epitaxial regions located at the edges of an STI region, as is known in the art.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

While the present invention has been particularly shown and described with respect to preferred embodiments, it will be understood by those skilled in the art that changes in forms and details may be made without departing from the spirit and scope of the described embodiments. It is therefore intended that the present invention not be limited to the exact forms and details described and illustrated, but fall within the scope of the appended claims.

The following embodiments describe methods for manufacturing two adjacent field effect transistors (FETs) isolated by the formation of a dummy gate of a different material between the adjacent FETs. The disclosed embodiments depict two adjacent FETs of the same type (i.e. both pFETs or both nFETs) for illustrative simplicity, but a person of ordinary skill in the art will understand how to manufacture embodiments where the adjacent FETs are of different types.

Figure 2A:
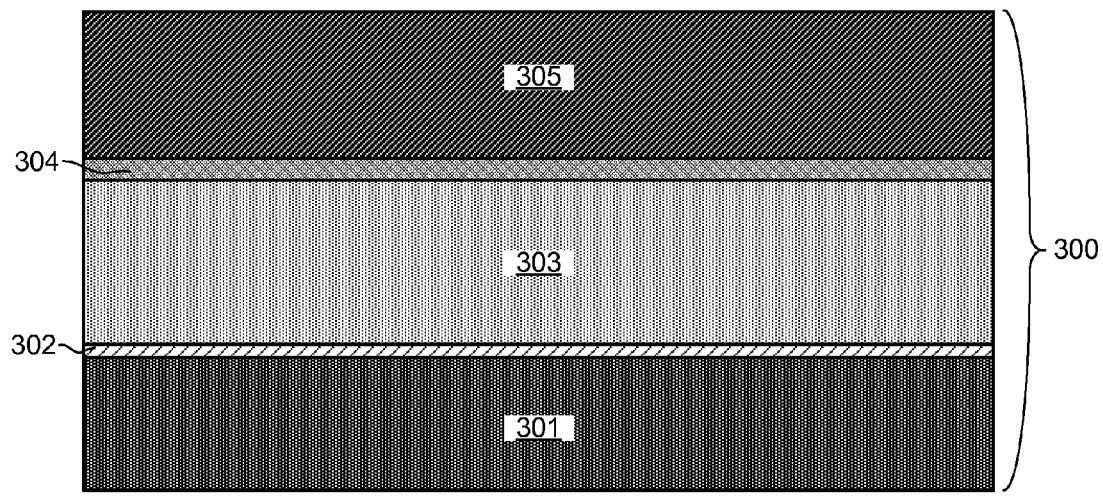
FIGS. 2A-2L are vertical cross-sectional views that illustrate the formation of a semiconductor structure having two transistor devices having sacrificial gates separated by a third sacrificial gate of the same material.

FIGS. 2A-2L depict a process of manufacturing two FET structures each having a sacrificial gate, and a third sacrificial gate of the same material separating the two FET structures. Referring to FIG. 2A, a layer stack 300 is depicted including, semiconductor substrate 301, dielectric layer 302, sacrificial gate layer 303, hard mask layer 304, and photoresist layer 305. Substrate 301 may be made of bulk silicon and may be 750-800 um thick. In other embodiments, substrate 301 may include a silicon-on-insulator (SOI) layer. Dielectric layer 302 may be made for example, silicon oxide, and may be 20-60 Å thick, preferably 25-45 Å. Sacrificial gate layer 303 may be made of silicon and may be 400-1000 Å thick, preferably 500-800 Å. Hard mask layer 304 may be made of nitride and be 300-1000 Å thick, preferably 400-700 Å. Layer stack 300 may be formed by any known methods in the art.

Figure 2B:
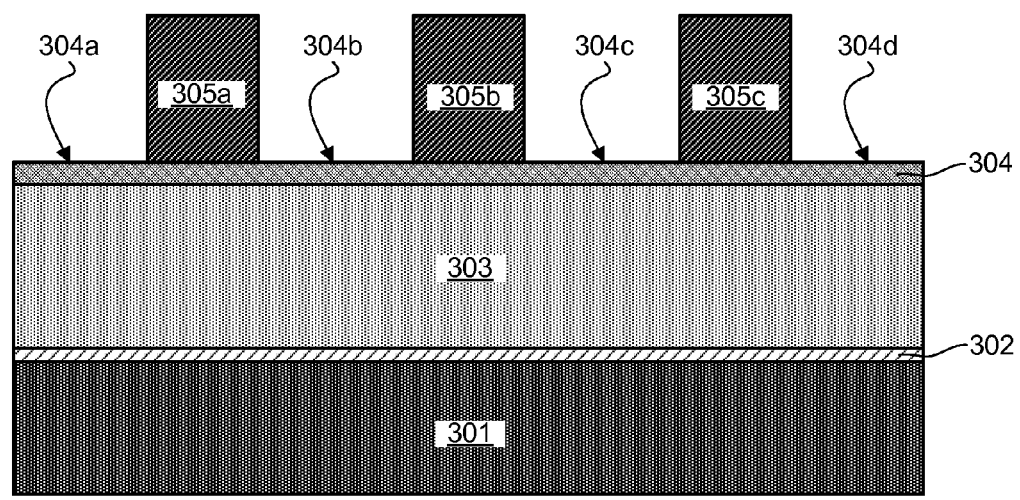

FIG. 2B depicts the removal of portions of photoresist layer 305 to form photoresist sections 305a, 305b, and 305c, and exposing surfaces 304a, 304b, 304c, and 304d of hard mask layer 304. The removed portions of photoresist layer 305 may be removed by any known methods in the art, including, but not limited to, developing photoresist layer 305 with a light source and wet etching the portions to be removed.

Figure 2C:
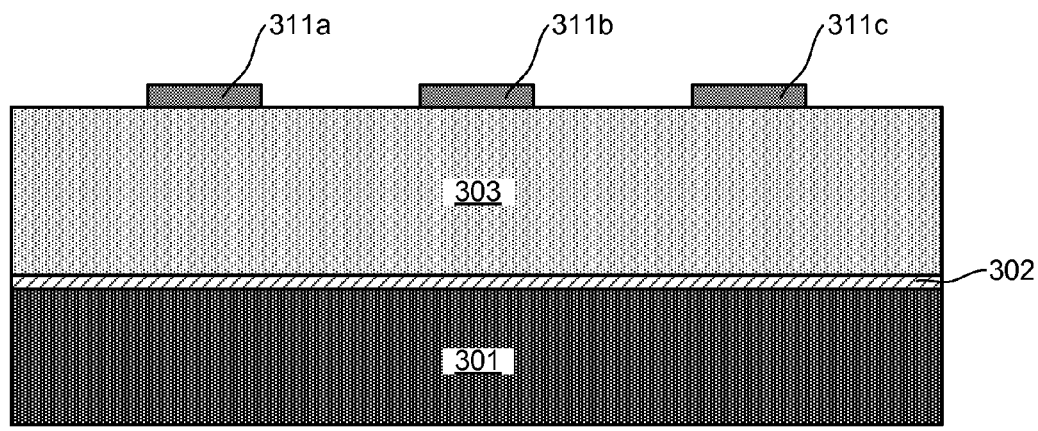

FIG. 2C depicts removing portions of hard mask layer 304 to form hard caps 311a, 311b, and 311c. A reactive ion etching (RIE) process may be used to etch exposed surfaces 304a, 304b, 304c, and 304d of hard mask layer 340 (FIG. 2B), while hard caps 311a, 311b, and 311c are protected by photoresist sections 305a, 305b, and 305c (FIG. 2B). Once hard caps 311a, 311b, and 311c are formed, photoresist sections 305a, 305b, and 305c are removed.

Figure 2D:
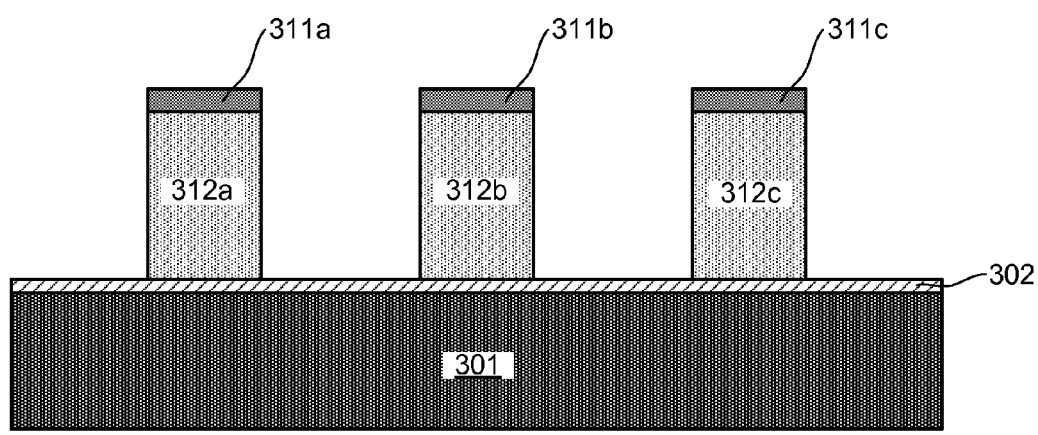
Figure 2E:
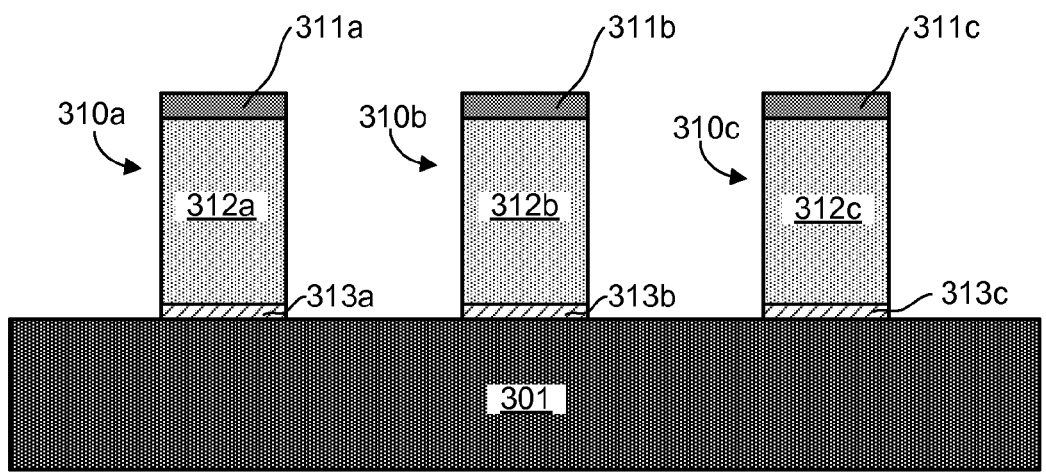

FIG. 2D-2E depicts forming gates 310a, 310b, and 310c by removing excess material from sacrificial gate layer 303 to form sacrificial gates 312a-312c (seen in FIG. 2D) and dielectric layer 302 to form dielectric layers 313a-313c (FIG. 2E). Material may be removed from sacrificial gate layer 303 and dielectric layer 302 using any method known in the art including, for example, a RIE process. As depicted in FIG. 2E, gates 310a-310c include hard caps 311a-311c, sacrificial gates 312a-312c, and dielectric layers 313a-313c, respectively.

Figure 2F:
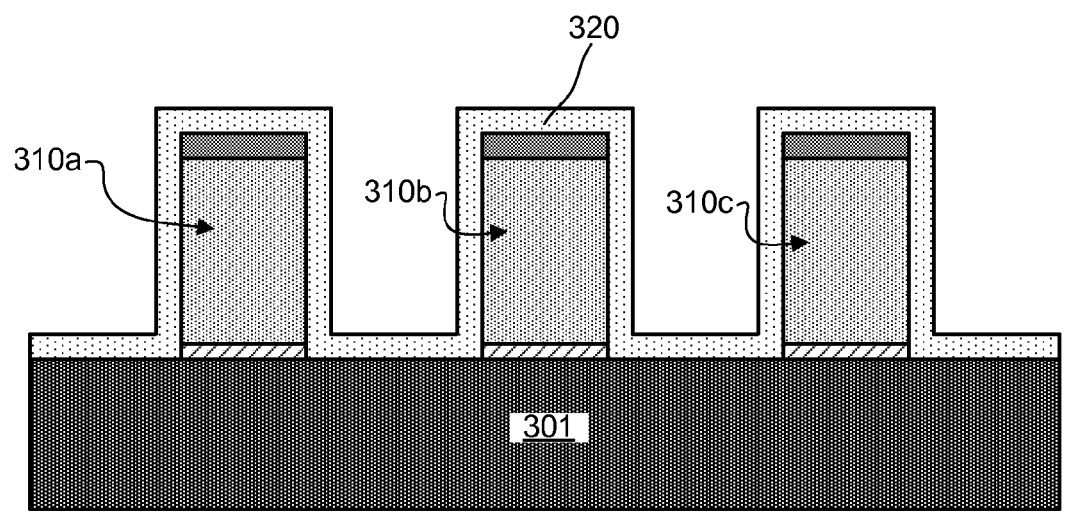
Figure 2G:
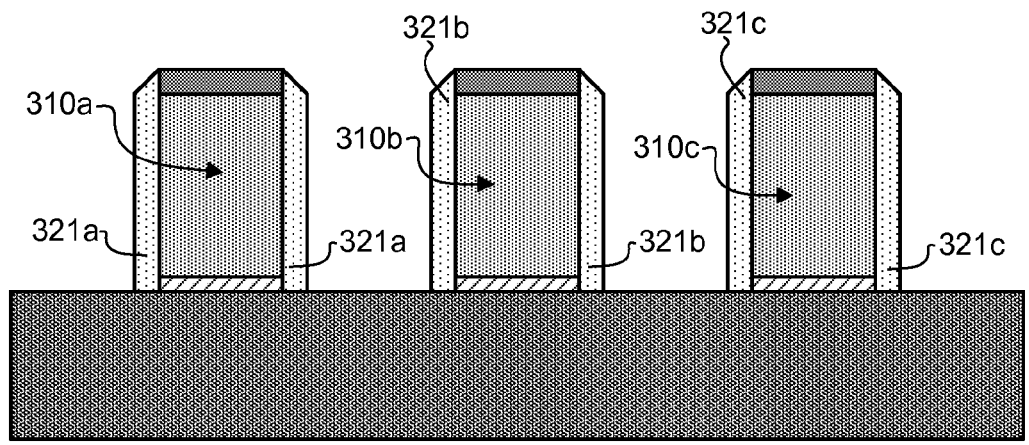

Referring to FIGS. 2F-2G, spacers 321a-321c (FIG. 2G) are formed on gates 310a-310c. FIG. 2F depicts the deposition of a spacer material layer 320 on the surface of each gate 310a-310c and the exposed top surface of substrate 301. Spacer material layer may be made of, for example, silicon nitride or silicon carbon nitride, and may be 50-400 Å thick, preferably 80-200 Å. FIG. 2G then depicts removing material from spacer material layer 320, using any known method in the art including, for example, a RIE process, to form spacers 321a-321c on gates 310a-310c, respectively. For the sake of illustrative simplicity, only one spacer on each gate is shown. However, some embodiments may include more than one set of spacers.

Figure 2H:
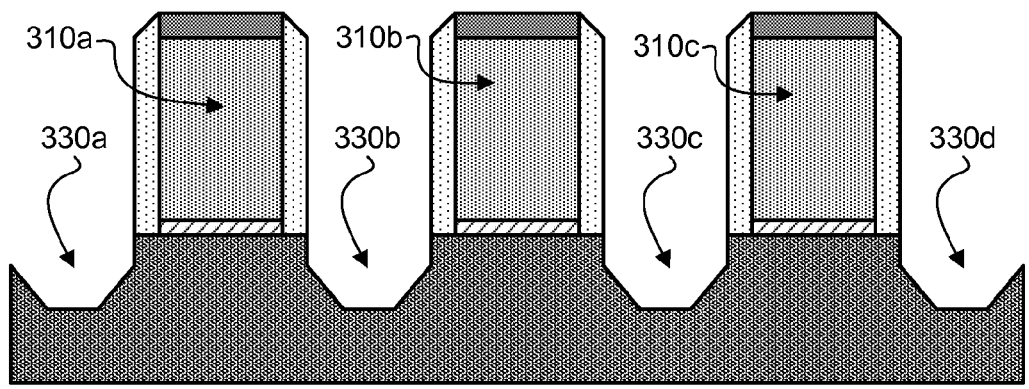
Figure 2I:
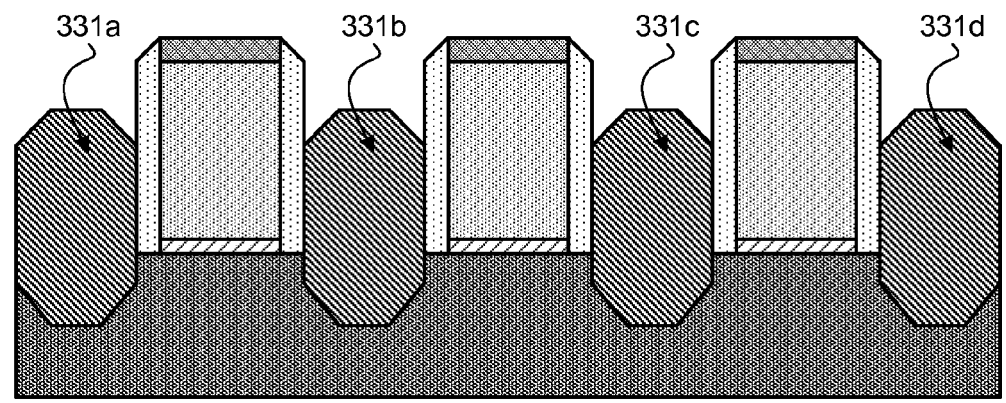

Referring to FIGS. 2H-2I, source/drain regions are formed between each gate 310a-310c. The depicted embodiment includes raised source/drain regions. However other embodiments may include other types of source/drain regions. As depicted in FIG. 2H, source/drain recesses 330a-330d may be formed in substrate 301 by any known method in the art, including, for example, an etch process using HBr-containing plasma. As depicted in FIG. 2I, source/drain regions 331a-331d may be formed by epitaxial growth of source/drain material in the respective source/drain recess 330a-330d (FIG. 3H). Possible source/drain materials include silicon, silicon carbide, and silicon-germanium. In some embodiments, source/drain regions 331a-331d may be doped.

Figure 2J:
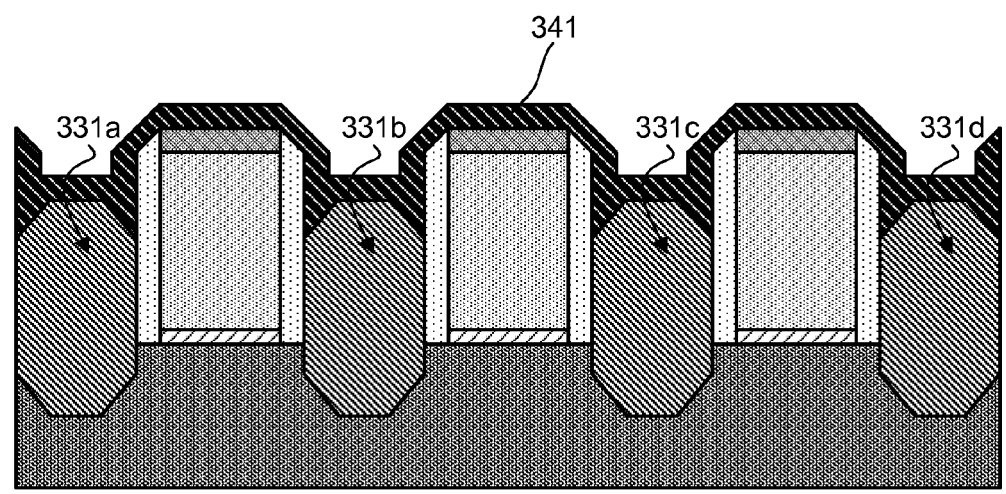
Figure 2K:
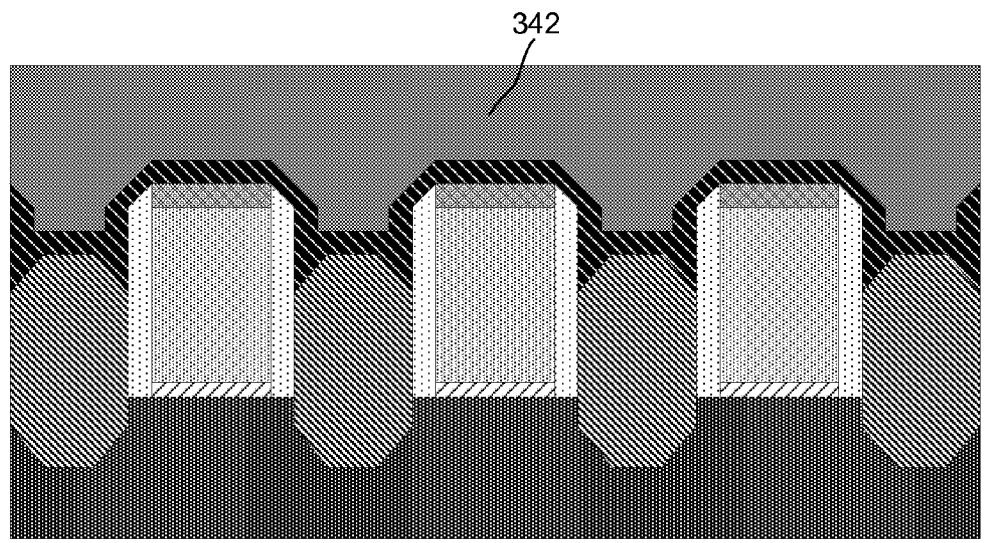
Figure 2L:
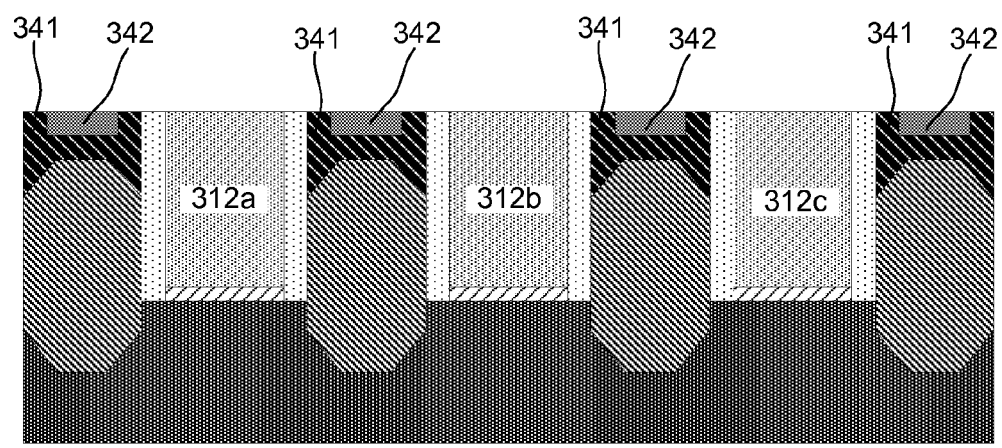

Referring to FIG. 2J, a Middle of Line (MOL) liner 341 may be deposited over the structure of FIG. 2I to protect the surfaces of the epitaxially grown source/drain regions 331a-331d. MOL liner 341 may be made of, for example, silicon nitride, silicon carbide, silicon carbon nitride, and may be 40-150 Å thick, preferably 60-100 Å. Referring to FIG. 2K, the surface of the structure of FIG. 2J may be covered by a MOL insulation layer 342. Referring to FIG. 2L, the structure of FIG. 2K may be planarized using chemical-mechanical planarization or any other known method in the art to expose sacrificial gates 312a-312c. It should be noted that the region of the substrate 301 between an outer sidewall of the sacrificial gate 312a (i.e., first gate) and an outer sidewall of the sacrificial gate 312c (i.e., second gate) may not contain an isolation structure formed therein.

First Embodiment

Figure 2M:
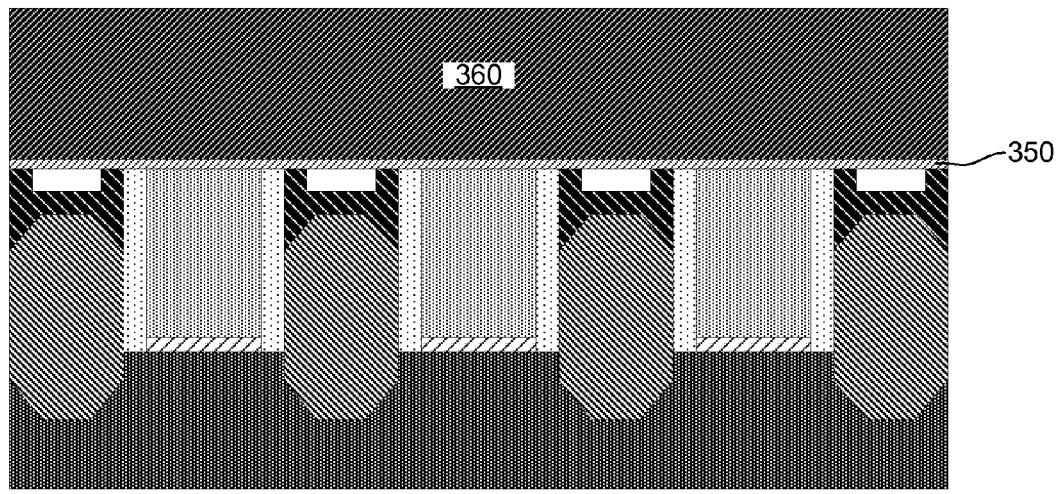
FIGS. 2M-2T are vertical cross-sectional views that illustrate replacing sacrificial gates of the two transistor structures with metal gates and the third sacrificial gate of FIGS. 2A-2L with a dummy gate of a different material, according to one embodiment of the invention.
Figure 2N:
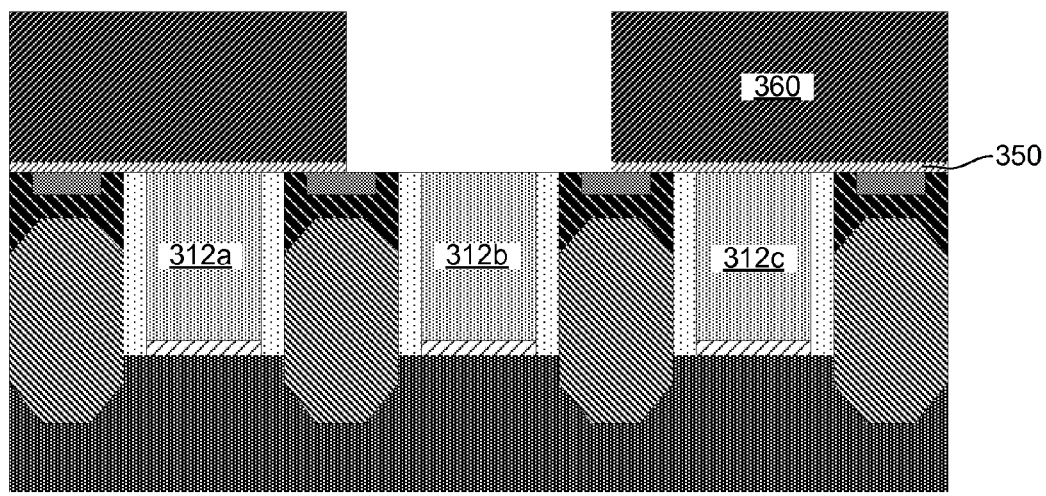
Figure 2O:
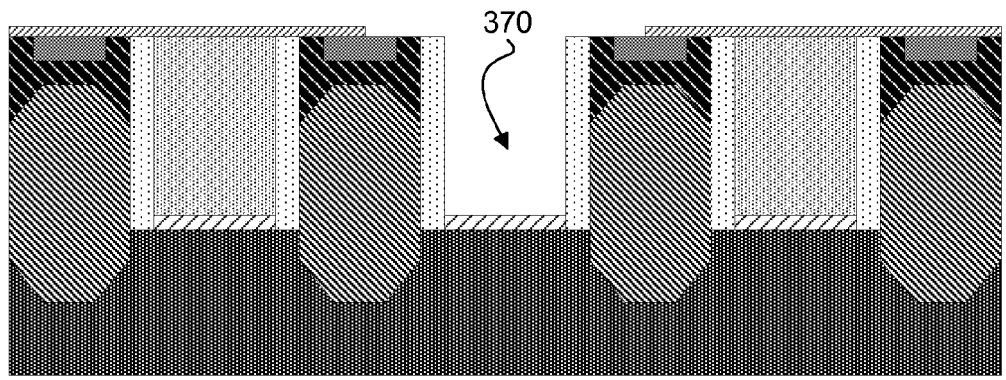
Figure 2P:
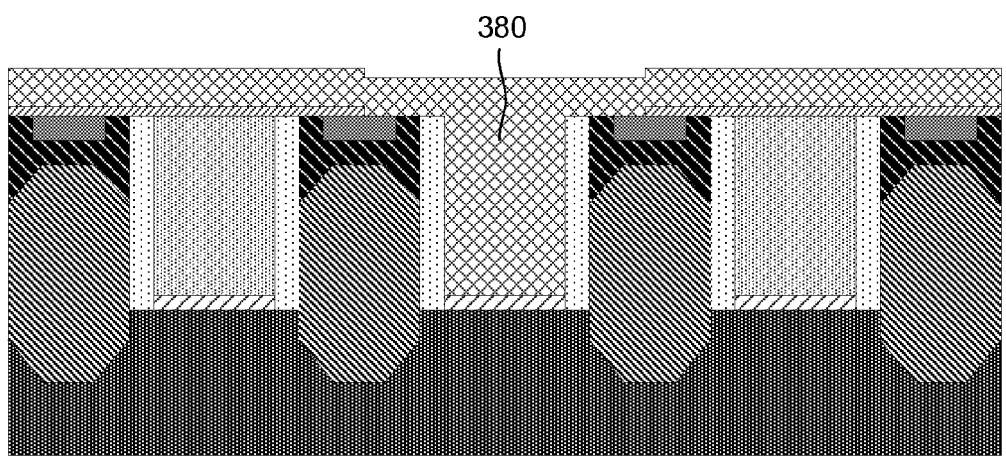
Figure 2Q:
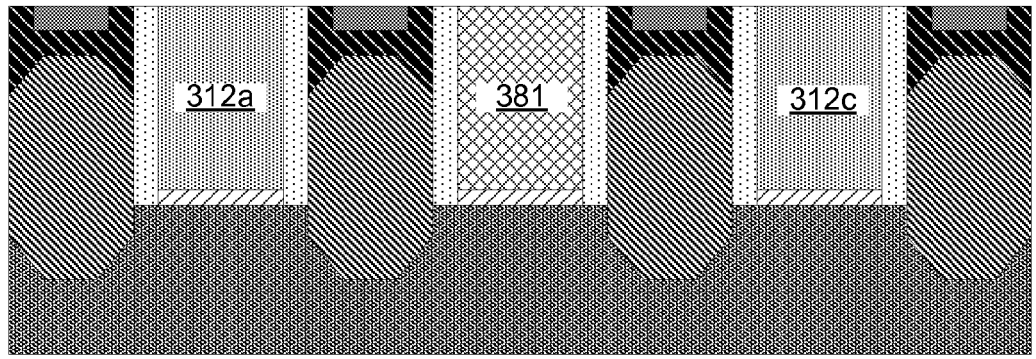

FIGS. 2M-2T refer to a process to replace sacrificial gate 312b of FIG. 2L with an insulating material, according to a first embodiment. As depicted in FIG. 2M, nitride layer 350 and photoresist layer 360 are deposited on the surface of the structure of FIG. 2J. Nitride layer 350 may be 30-200 Å thick, preferably 50 Å. As depicted in FIG. 2N, a portion of nitride layer 350 is removed so that sacrificial gate 312b is exposed while sacrificial gates 312a and 312c are still covered by the remaining portions of nitride layer 350. In the depicted embodiment, the portion of nitride layer 350 may be removed by patterning photoresist layer 360 and transferring the pattern into the nitride layer 350 through any known method in the art, including reactive ion etching, and then removing photoresist layer 360. As depicted in FIG. 2O, sacrificial gate 312b (FIG. 2N) is removed by any known method, including, for example, a RIE process or hydroxide-containing silicon-selective wet etch, to form opening region 370. As depicted in FIG. 2P, opening region 370 (FIG. 2O) may be filled with an insulating material 380 by any known deposition process. Insulating material 380 may overfill the region 370 so that the top surface of the structure of FIG. 2O is covered. Insulating material 380 may be made of, for example, silicon oxide or silicon nitride. As depicted in FIG. 2Q, the structure of FIG. 2P may be planarized using chemical-mechanical planarization or any other known method so that sacrificial gates 312a and 312c are exposed. The remaining insulator material 380 forms dummy gate 381.

Figure 2R:
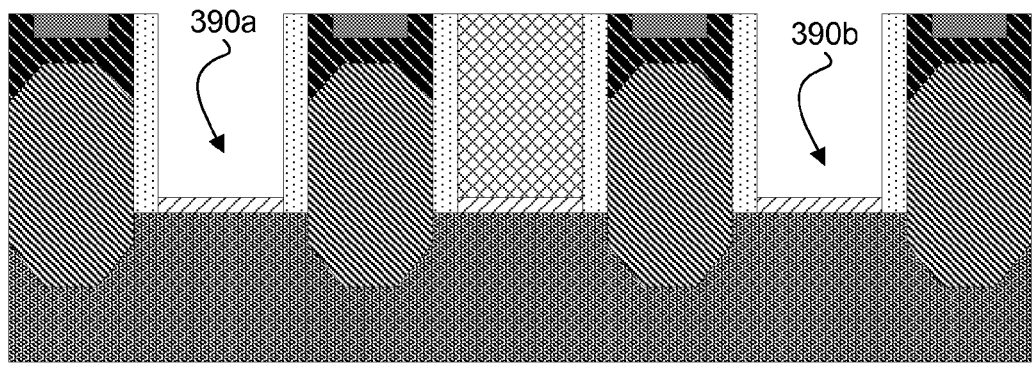
Figure 2S:
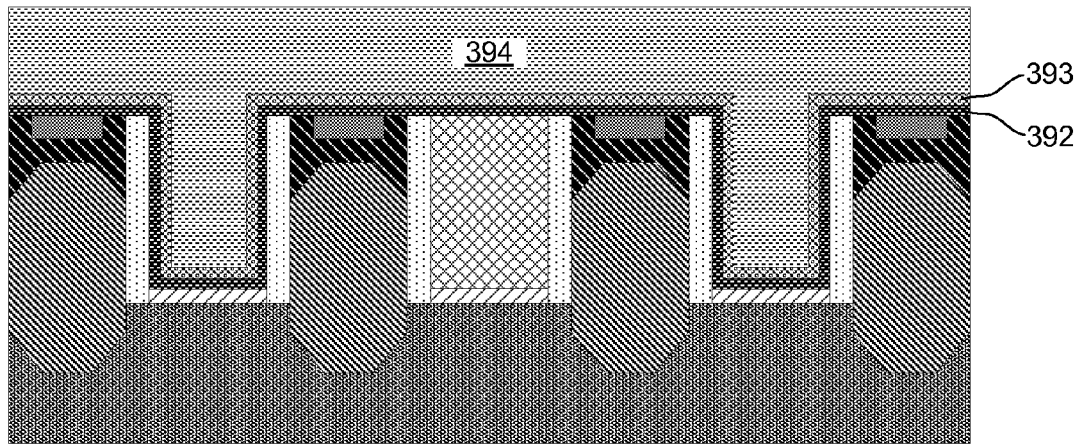
Figure 2T:
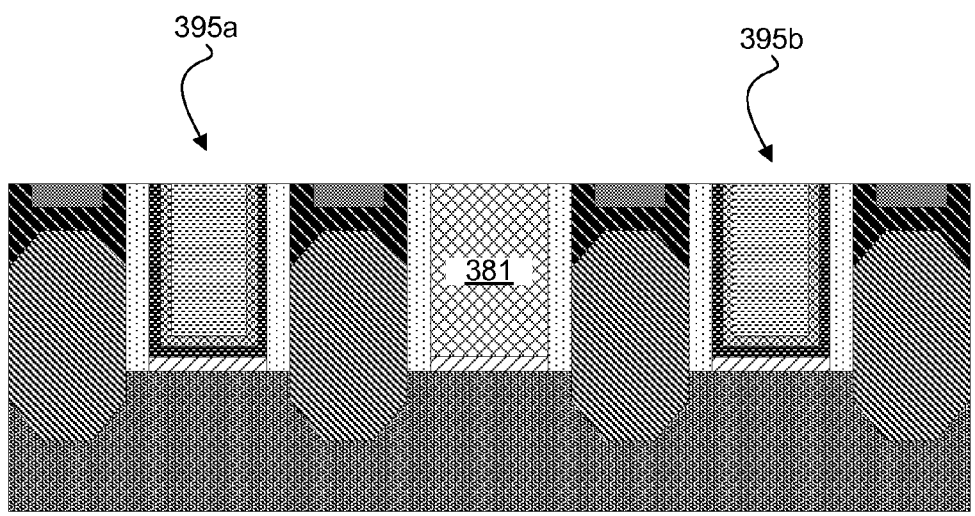

FIGS. 2R-2T refer to a process to replace sacrificial gates 312a and 312c with metal gates. As depicted in FIG. 2R, sacrificial gates 312a and 312c (FIG. 2Q) are removed by any known method, including, for example, an RIE process or a hydroxide-containing silicon-selective wet etch to form regions 390a and 390b. As depicted in FIG. 2S, various metals may then be deposited in regions 390a and 390b. In some embodiments, dielectric layers 313a and 313c are removed prior to metal deposition (not shown). The depicted embodiment includes a high-k dielectric layer (not shown), first work-function metal 392, a second work-function metal 393 and a metal film 394. High-k dielectric layer may be made of, for example, hafnium oxide or hafnium silicate. First work-function metal 392 may be made of, for example, a combination of titanium nitride and tantalum nitride. Second work-function metal 393 may be made of titanium-aluminum, titanium, or titanium nitride. Metal film 394 may be made of, for example, aluminum, titanium nitride, or tungsten. Other embodiments may include more or less metal layers depending on the application and types of device or devices being formed. The composition of each metal layer may also vary and the process of selecting the material for each metal layer is known in the art. As depicted in FIG. 2T, the structure of FIG. 2S may then be planarized using chemical-mechanical planarization or any other known method to expose dummy gate 381. The remaining portions of the high-k dielectric layer (not shown), first work-function metal 392, a second work-function metal 393 and metal film 394 form metal gates 395a and 395b. The structure is then ready for contact formation and/or fill processes.

Second Embodiment

Figure 3A:
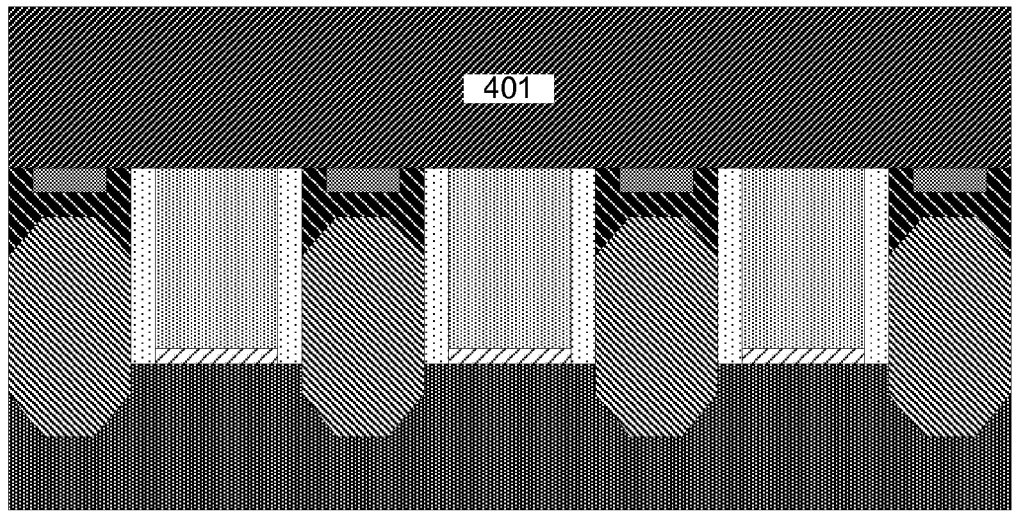
FIGS. 3A-3H are vertical cross-sectional views that illustrate replacing sacrificial gates of the two transistor structures with metal gates and the third sacrificial gate of FIGS. 2A-2L with a dummy gate of a different material, according to another embodiment of the invention.
Figure 3B:
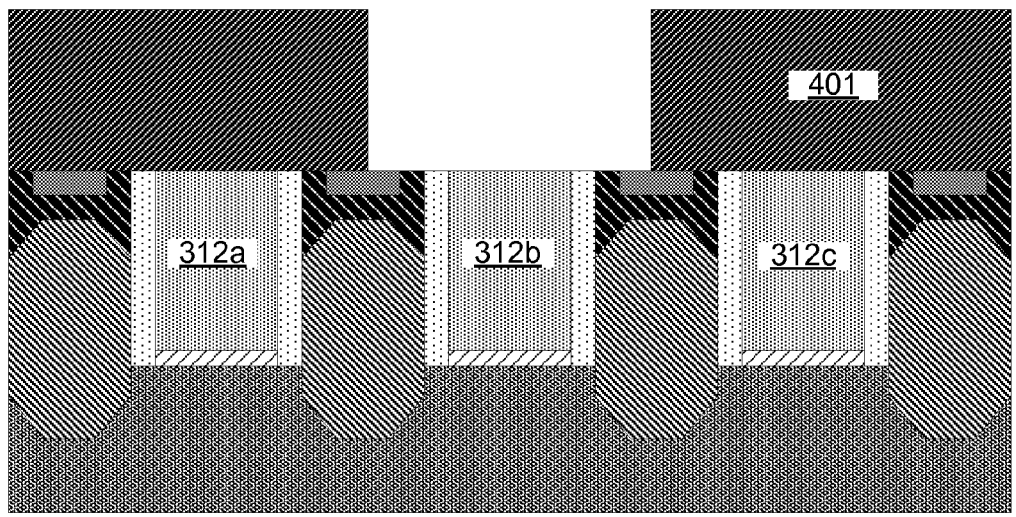
Figure 3C:
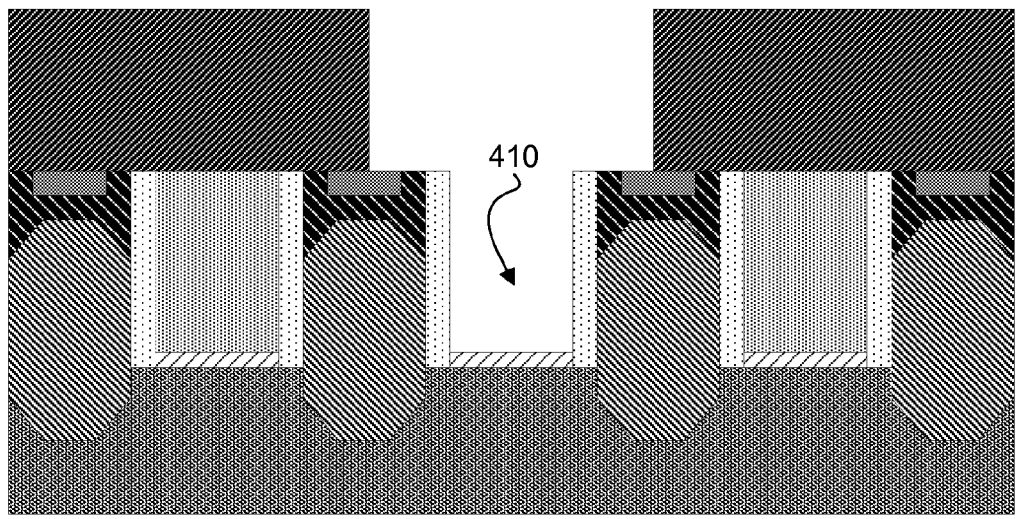
Figure 3D:
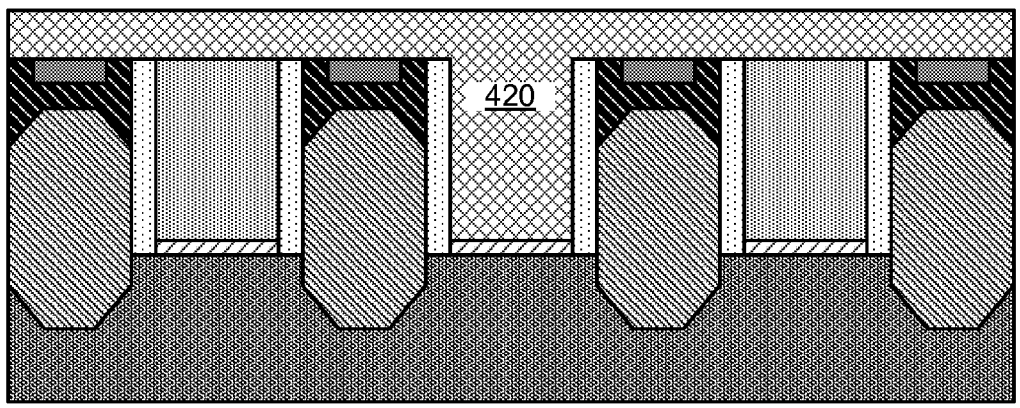
Figure 3E:
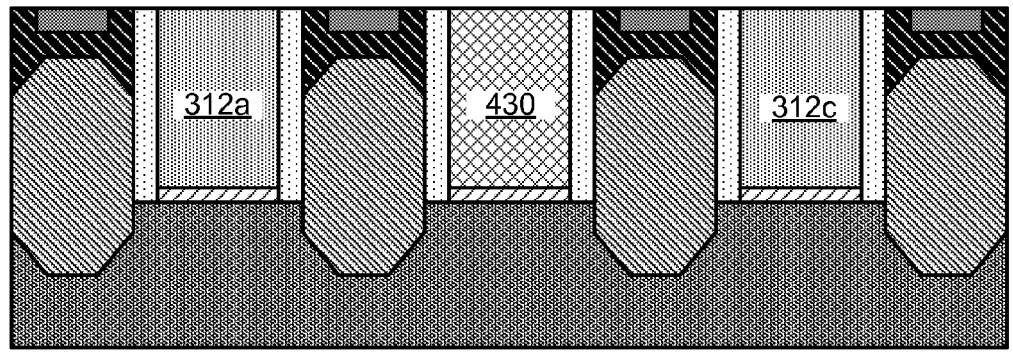
Figure 3F:
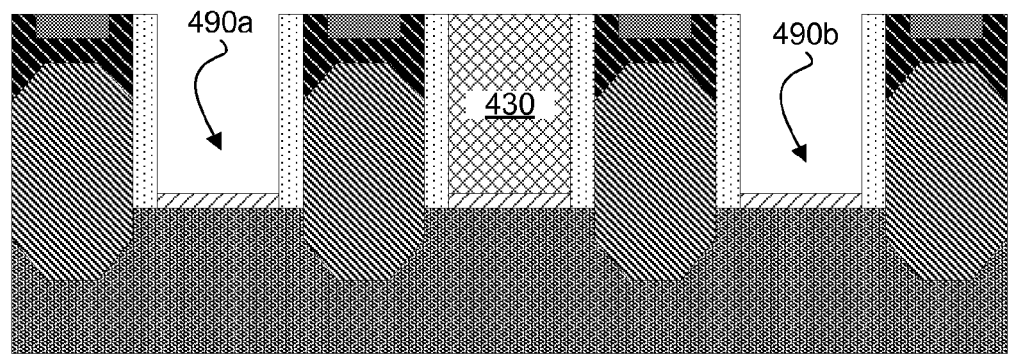
Figure 3G:
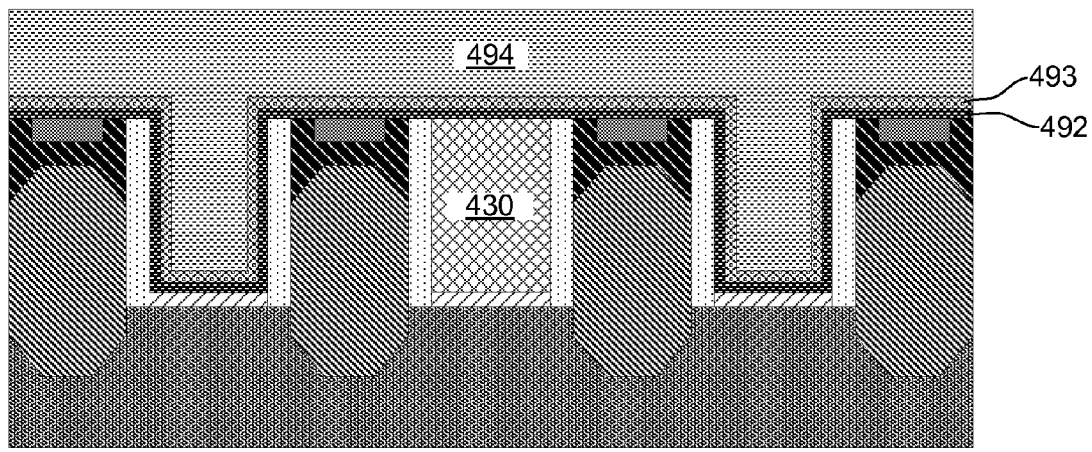
Figure 3H:
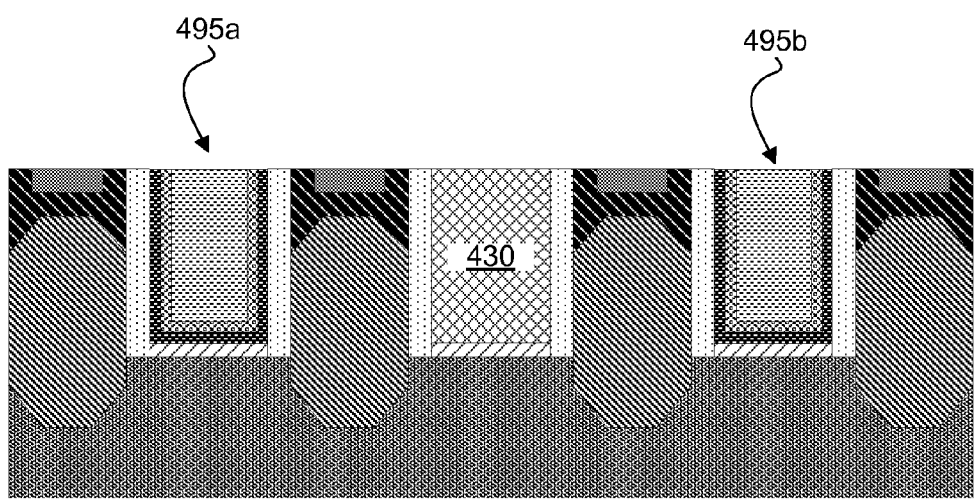

FIGS. 3A-3H refer to a process to replace sacrificial gate 312b of FIG. 2L with an insulating material, according to a first embodiment. As depicted in FIG. 3A, a photoresist layer 401 is deposited on the top surface of the structure of FIG. 2L. As depicted in FIG. 3B, photoresist layer 401 may be patterned to expose sacrificial gate 312b while not exposing sacrificial gates 312a and 312c. As depicted in FIG. 3C, sacrificial gate 312b (FIG. 3B) may be removed using an anisotropic etching process to form region 410. As depicted in FIG. 3D, photoresist layer 401 (FIG. 3C) is removed and region 410 (FIG. 3C) may be filled with an insulating material 420 by any known deposition process. Insulating material 420 may overfill the region 410 (FIG. 3C) so that the top surface of the structure of FIG. 3C is covered. Insulating material 420 may be made of, for example, silicon oxide or silicon nitride. As depicted in FIG. 3E, the structure of FIG. 3D may be planarized using, for example, chemical-mechanical planarization or any other known method so that sacrificial gates 312a and 312c are exposed. The remaining insulator material 420 forms dummy gate 430.

FIGS. 3F-3H refer to a process to replace sacrificial gates 312a and 312c with metal gates. As depicted in FIG. 3F, sacrificial gates 312a and 312c (FIG. 2Q) may be removed by any known method, including, for example, an RIE process or a hydroxide-containing silicon-selective wet etch to form regions 490a and 490b. As depicted in FIG. 3G, various metals may be then deposited in regions 490a and 490b. In some embodiments, dielectric layers 313a and 313c are removed prior to metal deposition (not shown). The depicted embodiment includes a high-k dielectric layer (not shown), first work-function metal 492, a second work-function metal 493 and a metal film 494. The high-k dielectric layer may be made of, for example, hafnium oxide or hafnium silicate. First work-function metal 492 may be made of, for example, a combination of titanium nitride and tantalum nitride. Second work-function metal 493 may be made of titanium-aluminum, titanium, or titanium nitride. Metal film 494 may be made of, for example, aluminum, titanium nitride, or tungsten. Other embodiments may include more or less metal layers depending on the application and types of device or devices being formed. The composition of each metal layer may also vary and the process of selecting the material for each metal layer is known in the art. As depicted in FIG. 3H, the structure of FIG. 3G may be then planarized using, for example, chemical-mechanical planarization or any other known method to expose dummy gate 430. The remaining portions of the high-k dielectric layer (not shown), first work-function metal 492, a second work-function metal 493 and metal film 494 form metal gates 495a and 495b. The structure is then ready for contact formation and/or fill processes.

Third Embodiment

Figure 4A:
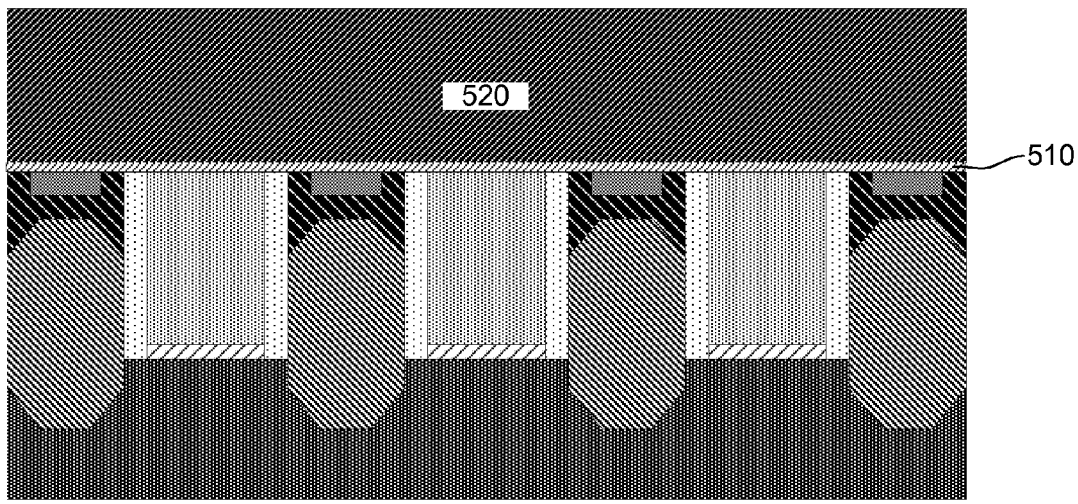
FIGS. 4A-4E are vertical cross-sectional views that illustrate replacing sacrificial gates of the two transistor structures with metal gates while leaving the third sacrificial gate in place to isolate the two transistor structures, according to one embodiment of the invention.
Figure 4B:
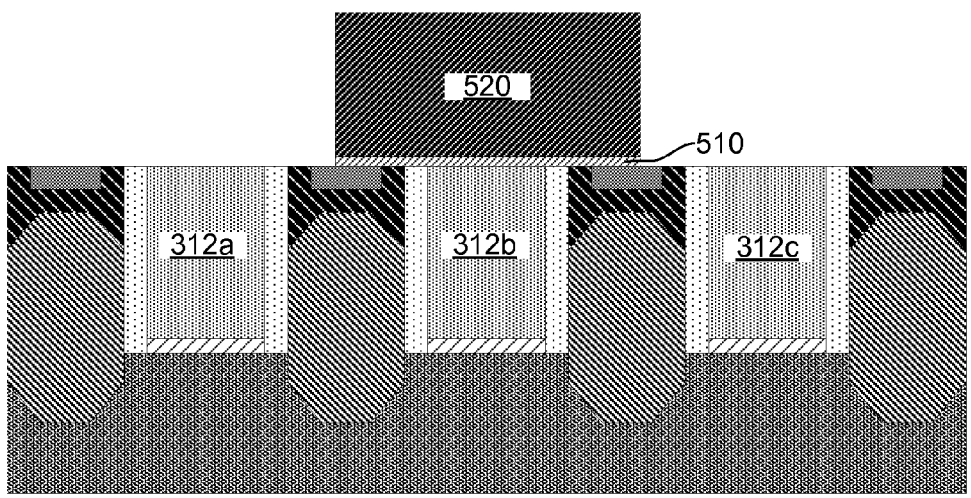

FIGS. 4A-4E refer to a process to replace sacrificial gates 312a and 312c of FIG. 2L with metal gates while leaving sacrificial gate 312b in place, according to a third embodiment of the present invention. As depicted in FIG. 4A, hard mask layer 510 and photoresist layer 520 are deposited on the surface of the structure of FIG. 2L. hard mask layer 510 may be made of nitride and be 30-200 Å thick, preferably 50 Å. As depicted in FIG. 4B, a portion of hard mask layer 510 is removed so that sacrificial gates 312a and 312c are exposed while sacrificial gate 312b is still covered by the remaining portions of hard mask layer 510. In the depicted embodiment, the portion of hard mask layer 510 may be removed by patterning the photoresist layer 520 and transferring the pattern into the hard mask layer 510 through any known method in the art, including reactive ion etching.

Figure 4C:
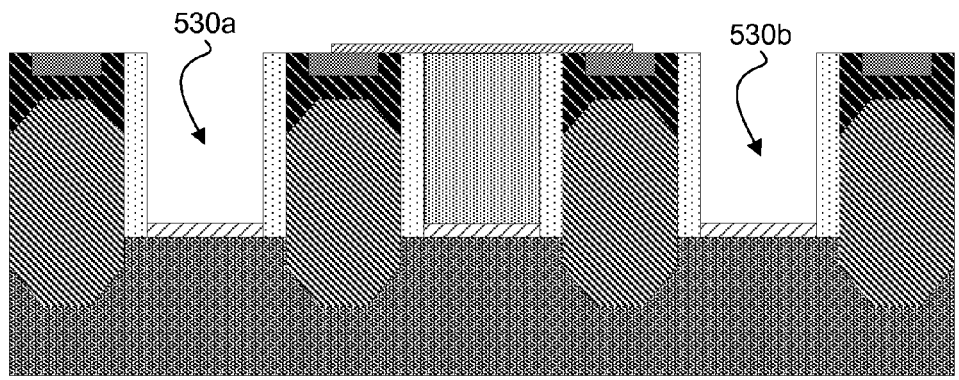
Figure 4D:
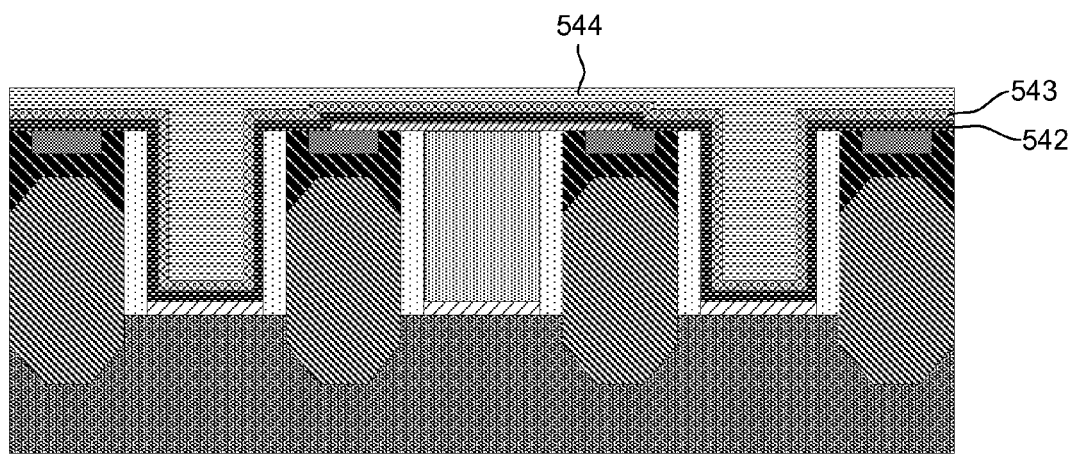

As depicted in FIG. 4C, photoresist layer 520 may be removed and sacrificial gates 312a and 312c (seen in FIG. 4B) are removed by any known method, including, for example, an RIE process or a wet etch selective to the material of the sacrificial gates, to form regions 530a and 530b. As depicted in FIG. 4D, various metals may then be deposited in regions 530a and 530b. In some embodiments, dielectric layers 313a and 313c are removed prior to metal deposition (not shown).

Figure 4E:
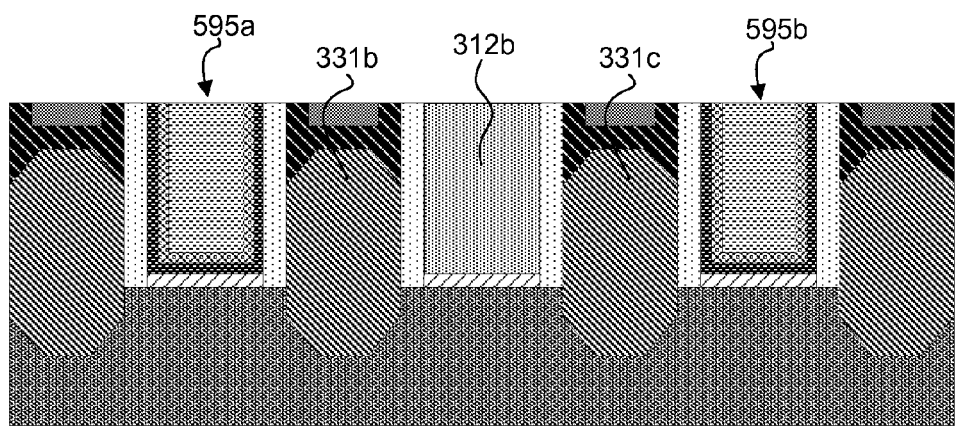

The depicted embodiment includes a high-k dielectric layer (not shown), first work-function metal 542, a second work-function metal 543 and a metal film 544. The high-k dielectric layer may be made of, for example, hafnium oxide or hafnium silicate. First work-function metal 542 may be made of, for example, a combination of titanium nitride and tantalum nitride. Second work-function metal 543 may be made of titanium-aluminum, titanium, or titanium nitride. Metal film 544 may be made of, for example, aluminum, titanium nitride, or tungsten. Other embodiments may include more or less metal layers depending on the application and types of device or devices being formed. The composition of each metal layer may also vary and the process of selecting the material for each metal layer is known in the art. As depicted in FIG. 4E, the structure of FIG. 4D may then be planarized using chemical-mechanical planarization or any other known method to expose sacrificial gate 312b, which will operate as a dummy gate. The remaining portions of the high-k dielectric layer (not shown), first work-function metal 592, a second work-function metal 593 and metal film 594 form metal gates 595a and 595b. In some embodiments, sacrificial gate layer 303 may be made of an insulating material so that sacrificial gate 312b can better insulate source/drain region 331b from source/drain region 331c. The structure is then ready for contact formation and/or fill processes.

What is claimed is:

1. A method of forming a structure on a semiconductor substrate comprising:
    forming on the semiconductor substrate, a first sacrificial gate, a second sacrificial gate, and a third sacrificial gate located between the first sacrificial gate and the second sacrificial gate, wherein a region of the semiconductor substrate between an outer sidewall of the first sacrificial gate and an outer sidewall of the second sacrificial gate does not contain an isolation structure;
    forming spacers on sidewalls of the first sacrificial gate, the second sacrificial gate, and the third sacrificial gate;
    forming a first source/drain on the semiconductor substrate between the first sacrificial gate and the third sacrificial gate, and a second source/drain on the semiconductor substrate between the second sacrificial gate and the third sacrificial gate;
    forming a middle of line (MOL) liner on the first source/drain and the second source/drain, the MOL liner having an upper surface that is substantially flush with an upper surface of the third sacrificial gate;
    removing the third sacrificial gate to form a dummy recess region; and
    filling the dummy recess region with insulating material thereby creating an insulating region between the first sacrificial gate and the second sacrificial gate, the insulating region having an upper surface that is substantially flush with the upper surface of the MOL liner;
    removing the first sacrificial gate and the second sacrificial gate selective to the exposed insulating region, the MOL liner, and the spacers to form gate recesses; and
    forming metal gates in the gate recesses.

2. The method of claim 1, wherein removing the third sacrificial gate to form a dummy recess region comprises:
    depositing a photoresist layer over the first sacrificial gate, the second sacrificial gate, and the third sacrificial gate;
    removing a portion of the photoresist layer covering the third sacrificial gate but not covering the first sacrificial gate and the second sacrificial gate to expose the third sacrificial gate underneath thereof; and
    removing the third sacrificial gate by an etching process while the first sacrificial gate and the second sacrificial gate are protected by the photoresist layer.

3. The method of claim 2, wherein the third sacrificial gate is made of silicon.

4. The method of claim 3, wherein removing the third sacrificial gate comprises etching the sacrificial gate using a silicon-selective anisotropic etching process.

5. The method of claim 3, wherein the anisotropic etching process is a reactive ion etching process.

6. The method of claim 1, removing the third sacrificial gate to form a dummy recess region comprises:
    depositing a nitride layer over the first sacrificial gate, the second sacrificial gate, and the third sacrificial gate;
    depositing a photoresist layer on the nitride layer;
    removing a portion of the photoresist layer to expose a portion of the nitride layer covering the third sacrificial gate but not covering the first sacrificial gate and the second sacrificial gate;
    etching the exposed portion of the nitride layer; and
    etching the third sacrificial gate while the first sacrificial gate and second sacrificial gate are protected by the nitride layer.

7. The method of claim 6, wherein the third sacrificial gate is made of silicon.

8. The method of claim 7, wherein etching the third sacrificial gate comprises wet etching with a hydroxide-containing chemistry.

9. The method of claim 7, wherein etching the third sacrificial gate comprises a silicon-selective anisotropic etching process.

10. The method of claim 9, wherein the anisotropic etching process comprises reactive ion etching.

11. The method of claim 1, wherein filling the dummy gate recess region with an insulating material comprises depositing silicon oxide or silicon nitride in the dummy gate recess region.

12. The method of claim 1, further comprising depositing an insulator layer over the first sacrificial gate, the second sacrificial gate, and the third sacrificial gate; and planarizing the insulator layer to expose the first sacrificial gate, the second sacrificial gate, and the third sacrificial gate prior to removing the third sacrificial gate.

13. The method of claim 1, wherein the forming metal gates in the gate recesses comprises:
    depositing a first work-function metal on the exposed insulating region, the MOL liner, and the spacers;
    depositing a second work-function metal on the first work-function metal;
    depositing a metal film on the second work-function metal; and
    removing a portion of the metal film, a portion of the second work-function metal, and a portion of the first work-function metal, such that an upper surface of the metal film, an upper surface of the second work-function metal, and an upper surface of the first work-function metal are substantially flush with the upper surface of the MOL liner and the upper surface of the insulating region.

14. The method of claim 13, wherein the removing the portion of the metal film, the portion of the second work-function metal, and the portion of the first work-function metal comprises:
    performing a planarization process.

* * * * *